United States Patent [19]

Ohnishi et al.

[11] Patent Number: 4,812,712
[45] Date of Patent: Mar. 14, 1989

[54] PLASMA PROCESSING APPARATUS

[75] Inventors: Youichi Ohnishi, Higashiosaka; Akira Okuda, Sakai; Hiromi Shima, Hirakata; Shinichi Mizuguchi, Katano, all of Japan

[73] Assignee: Matsushita Electric Industrial Co., Ltd., Osaka, Japan

[21] Appl. No.: 861,305

[22] Filed: May 9, 1986

[30] Foreign Application Priority Data

| May 9, 1985 | [JP] | Japan | 60-98366 |
| May 9, 1985 | [JP] | Japan | 60-98368 |
| Sep. 20, 1985 | [JP] | Japan | 60-209183 |
| Dec. 20, 1985 | [JP] | Japan | 60-288566 |

[51] Int. Cl.[4] ............................ C23C 15/00
[52] U.S. Cl. .................... 315/176; 315/111.21; 315/111.31; 315/115; 315/108; 315/175; 427/38; 204/298
[58] Field of Search ............ 315/111.21, 111.71, 315/111.31, 111.41, 176, 39, 111.81, 111.91; 427/37, 38, 36, 50, 255, 255.2, 255.3, 294, 295, 314, 252, 253, 249; 118/620, 715; 204/298

[56] References Cited

U.S. PATENT DOCUMENTS

| 3,988,566 | 11/1976 | Vogts et al. | 315/111.21 |
| 4,201,579 | 5/1980 | Robinson et al. | 315/111.21 |
| 4,292,384 | 9/1981 | Straughan et al. | 219/121 PD |
| 4,434,387 | 2/1984 | MacMaster et al. | 315/39 |
| 4,602,193 | 7/1986 | Patonay et al. | 315/176 |
| 4,630,566 | 12/1986 | Asmussen et al. | 315/111.81 |

FOREIGN PATENT DOCUMENTS

| 0083944 | 7/1983 | European Pat. Off. | 315/111.21 |
| 2113509 | 8/1983 | United Kingdom | 315/111.21 |

Primary Examiner—David K. Moore
Assistant Examiner—Mark R. Powell
Attorney, Agent, or Firm—Wenderoth, Lind & Ponack

[57] ABSTRACT

A plasma processing apparatus wherein a means is provided to apply the proper negative DC voltage through a filter circuit to an electrode for generating the low-temperature plasma through the feed of the high-frequency power. When the high-frequency power has been fed in the higher high-frequency power density to the electrode for generating the low temperature plasma, the sparks (abnormal discharge) easy to be generated are prevented from being caused to generate the stable low-temperature plasma for better plasma processing.

10 Claims, 7 Drawing Sheets

| negative D.C. voltage (V) \ high-frequency power (W) | 25 [0.08W/cm²] | 50 [0.16W/cm²] | 100 [0.33W/cm²] |
|---|---|---|---|
| 0 | X ( 0.03mA) | X ( 0.09mA) | X ( 0.09mA) |
| -20 | X ( 0.00mA) | X | X |
| -40 | X ( 0.00mA) | X ( 0.09mA) | X |
| -60 | X (-0.01 mA) | X ( 0.04 mA) | X |
| -80 | ○ (-0.01 mA) | X ( 0.02mA) | X |
| -100 | ○ (-0.02mA) | X ( 0.00mA) | X ( 0.09mA) |
| -120 | ○ (-0.02mA) | X (-0.01 mA) | X ( 0.08mA) |
| -140 | ○ (-0.02mA) | ○ (-0.01 mA) | X |
| -160 | ○ (-0.02mA) | ○ (-0.02mA) | X |
| -180 | ○ (-0.02mA) | ○ | X |
| -200 | ○ (-0.02mA) | ○ (-0.02mA) | X ( 0.03mA) |
| -220 | ○ (-0.02mA) | ○ | X ( 0.00mA) |
| -230 | ○ (-0.02mA) | ○ | X |
| -240 | △ (-0.54mA or more) | ○ | ○ (-0.01 mA) |
| -260 | △ ( ″ ) | ○ | ○ (-0.02mA) |
| -280 | △ ( ″ ) | ○ | ○ (-0.02mA) |
| -300 | △ ( ″ ) | ○ (-0.02mA) | ○ |
| -320 | △ ( ″ ) | △ (-0.73mA or more) | ○ |
| -340 | △ ( ″ ) | △ | ○ (-0.02mA) |
| -360 | △ ( ″ ) | △ | △ (-0.21mA or more) |
| -380 | △ ( ″ ) | △ | △ | pressure : 260m Torr
distance between electrodes : 55mm
gas flow rate : SiH4 13 sccm
NH3 31 sccm
N2 142 sccm

Fig. 3

Fig. 4 pressure : 260m Torr
distance between electrodes : 55mm
temperature : 300°C
high-frequency power : 0.33w/cm²
gas flow rate : SiH₄ 13 sccm
NH₃ 31 sccm
N₂ 142 sccm

Fig. 10

| negative D.C. voltage (V) | presence of spark | D.C. current (mA) |
|---|---|---|
| 0 | X | 0.08 |
| -100 | X | 0.00 |
| -110 | O | -0.02 |
| -120 | O | -0.03 |
| -130 | O | -0.05 |
| -140 | O | -0.07 |
| -160 | O | -0.09 |
| -180 | O | -0.12 |
| -200 | O | -0.18 |
| -240 | △ | -0.35 |

PLASMA PROCESSING APPARATUS

BACKGROUND OF THE INVENTION

The present invention relates to a plasma processing apparatus such as a plasma vapor-phase growth apparatus for forming thin film by a plasma (CVD) (Chemical Vapor Deposition) method, a dry etching apparatus for using a low-temperature plasma to perform an etching operation on the surfaces of an object, and the like.

The plasma processing for thin-film forming by the plasma CVD method or for dry-etching using the low-temperature plasma is indispensable in the semiconductor process in recent years.

In these plasma processes, there is a technical problem to quicken the processing speed (in the plasma CVD, the accumulation speed, in the dry etching, the etching speed). In order to realize the high speed, it is required to increase the density of the high-frequency power which is adapted to generate the plasma.

However, increasing of the high-frequency power density is likely to cause sparks on the surfaces on the high-frequency electrode, with the result that the following problems are caused.

(1) In the case of the plasma CVD:
 (a) Particles adhere on the object for accumulating the vapor-phase thin to easily cause the film defect.
 (b) As the gas feed condition or the plasma condition for accumulating the CVD changes unstably, dispersion is caused in the film thickness and the film quality so as to deteriorate reproducibility.
 (c) High-frequency noises are caused, thus reducing the reliability of the plasma CVD apparatus itself.

(2) In the case of the dry etching (i.e., plasma etching):
 (a) As the plasma condition becomes unequal, the uniformity of etching is likely to be deteriorated or the resist damages are likely to be caused.
 (b) The high-frequency noises are caused, thus reducing the reliability of the plasma CVD apparatus itself.

Because of the above-described reasons, to realize the high speed of the plasma processing, it is an important task to prevent the sparks from occurring in the high-frequency electrode, which applies the high-frequency power for generating the plasma.

SUMMARY OF THE INVENTION

Accordingly, an essential object of the present invention is to provide means for preventing sparks from being caused in the high-frequency density in a plasma processing apparatus for performing the plasma CVD or the dry etching.

Another important object of the present invention is to control the formation of accumulation adhering to the surfaces of the high-frequency electrode, which applies high-frequency power for generating plasma in the plasma processing apparatus for performing the plasma CVD.

In accomplishing these objects, according to the preferred embodiments of the present invention, there is provided a plasma processing apparatus which includes a vacuum container which may retain the vacuum condition, a vacuum exhaust means for turning the vacuum-container interior into the reduced-pressure atmosphere, a pressure control means for turning the pressure within the vacuum container into a given value, a gas supply means for introducing the gas to accumulate the plasma CVD film on an object, a means for heating, controlling the object, an object retaining means for retaining the object, an electrode which is located within the vacuum container, for generating a low-temperature plasma in the space wherein a high-frequency power is supplied, the object is contained at least in a given pressure condition, a high-frequency power supply for supplying the high-frequency power through a matching circuit to the electrode, a DC power supply for loading through a filter circuit the negative DC voltage together with the high-frequency power to the electrode.

Also, in addition to the mechanism, the present invention is provided with a current measuring means, which is disposed between the DC power supply and the filter circuit to measure the DC current flowing to the DC power supply and the section of the filter circuit.

Also, in addition further to the above-described construction, the present invention is provided with a means, which controls the negative DC voltage value from the DC power supply in accordance with the value of the current measured by the DC measuring means.

Furthermore, the plasma processing apparatus of the present invention is provided with the vacuum container which may retain the vacuum condition, the vacuum exhaust means for turning the vacuum-container interior into the reduced-pressure atmosphere, the pressure control means for turning the pressure within the vacuum container into a given value, the gas supply means for introducing into the vacuum container the gas including inert gas for accumulating the plasma CVD film on the object, the means for heating, controlling the object, the object retaining means for retaining the object, the electrode which is located with the vacuum container, for generating the low-temperature plasma in the space where the high-frequency power is supplied, the object is contained at least in a given pressure condition, the high-frequency power supply for supplying the high-frequency power through the matching circuit to the electrode, the DC power supply for loading through the filter circuit the negative DC voltage from 50 V to 1,000 V, together with the high-frequency power to the electrode.

Furthermore, also, the plasma processing apparatus of the present invention is provided with the vacuum container which may retain the vacuum condition, the vacuum exhaust means for turning the vacuum-container interior into the reduced-pressure atmosphere, the pressure control means for turning the pressure within the vacuum container into a given value, the gas supply means for introducing the gas for dry-etching the object into the vacuum container, the object retaining means for retaining the object, the electrode which is located with the vacuum container, for generating the low-temperature plasma in the space where the high-frequency power is supplied, the object is contained at least in a given pressure condition, the high-frequency power supply for supplying the high-frequency power through the matching circuit to the electrode, the DC power supply for loading through the filter circuit the negative DC voltage together with the high-frequency power to the electrode.

Also, in addition to the construction, the present invention is provided with a current measuring means, which is disposed between the DC power supply and the filter circuit to measure the DC current to flow to the DC power supply and the section of the filter circuit.

Also, in addition further to the construction, the present invention is provided with a means for controlling the negative current voltage value from the DC power supply in accordance with the value of the current measured by the current measuring means.

BRIEF DESCRIPTION OF THE DRAWINGS

These and other objects and features of the present invention will become apparent from the following description taken in conjunction with the preferred embodiments thereof with reference to the accompanying drawings, in which.

DETAILED DESCRIPTION OF THE INVENTION

Before the description of the present invention proceeds, it is to be noted that like parts are designated by like reference numerals throughout the accompanying drawings.

Figure 1:
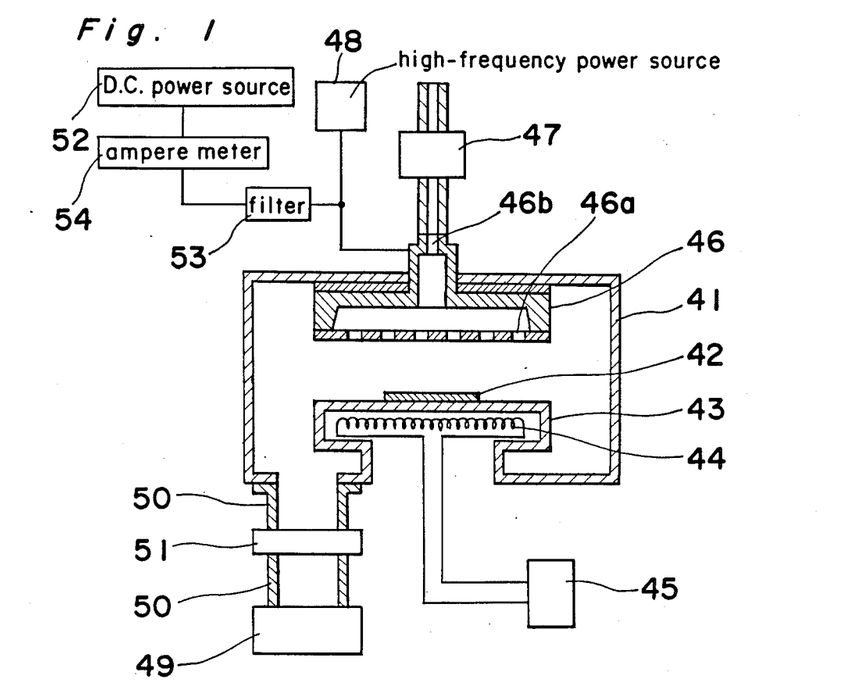
FIG. 1 is a schematic sectional view of a plasma processing apparatus in a first embodiment of the present invention.

Referring now to FIG. 1, there is shown a schematic sectional view of a plasma processing apparatus in a first embodiment of the present invention.

In FIG. 1, reference numeral 41 is a vacuum container which may retain the vacuum condition. Reference numeral 42 is a sample as an object on which the plasma CVD film is formed. Reference numeral 43 is an earthed sample stand as an object retaining means, which retains the sample 42, and has a heating apparatus therein to heat the sample 42. Reference numeral 44 is a heating apparatus placed within the sample stand 43. Reference numeral 45 is an AC power supply. Reference numeral 46 is an electrode of aluminum in material, wherein the high-frequency power of 50 KHz and the negative DC voltage are fed at the same time, many holes each being 0.8 mm in diameter are provided in the face opposite to the sample 42, and a compound gas containing the composition element of thin film to be formed on the surface of the sample 42 may be fed into the vacuum container 41 through these holes. Reference numeral 46a shows a plurality of holes for introducing the compound gas into the vacuum container 41. Reference numeral 46b is a feed port for feeding the compound gas into the electrode 45. Reference numeral 47 is a gas flow control apparatus. Reference numeral 48 is a high-frequency power supply of the frequency of 50 KHz. Reference numeral 49 is a vacuum pump as a vacuum exhaust means for turning the pressure within the vacuum container 41 into the vacuum degree of the atmospheric pressure. Reference numeral 50 is a pipe for vacuum exhaust use which air-tightly connects between the vacuum container 41 and the vacuum pump 49. Reference numeral 51 is a pressure control apparatus for controlling the pressure within the vacuum container 41. Reference numeral 52 is a DC power supply for feeding the negative DC voltage through the filter circuit to the electrode 46. Reference numeral 53 is a filter circuit for preventing the high-frequency power from the DC power supply 52. Reference numeral 54 is an ammeter as a current measuring means for measuring the DC current flowing into the section between the filter circuit 53 and the DC power supply 52.

The operation will be described about the plasma processing apparatus constructed as hereinabove described with reference to FIGS. 1 through 4.

First, the vacuum container 41 is exhausted in vacuum as far as the vacuum degree of 30 mTorr or lower by the vacuum pump 49, thereafter the compound gases containing the composition element of thin film to be formed on the surface of the sample 42, i.e., the blended gases of monosilane ($SiH_4$), ammonia ($NH_3$), nitrogen ($N_2$) are respectively introduced into the vacuum container 41 from the hole 46a of the electrode 46 through the electrode 46 from the gas flow control apparatus 47 respectively in the gas flow of 13 SCCM, 31 SCCM, 142 SCCM, standard cubic centimeters per minute and the pressure within the vacuum container 41 is retained at 260 mTorr through the operation of the pressure control apparatus 51. Also, the sample 42 is heated and controlled to the temperature of 300° C. by the sample stand 43. Then, the negative DC voltage of −250 V from −200 V is applied from the DC power supply 52 into the electrode 46. Further, the high frequency power of the frequency 50 kHz is fed in 0.33 W/cm² (100 W) to generate the low-temperature plasma in the space containing the sample 42. At this time, the value of the ammeter 54 is confirmed, the DC power supply is operated so that the value may become closer to −0.02 mA to correct the negative DC voltage value. In our experiment, it was corrected to −280 V. Through the above-described operation, the silicone nitride film within 1.998±0.02 in refractive index, ±3% in film thickness distribution could be formed without generating the spark in the hole 46a, Also, the number of the particles of 0.3 μm or more, among the spark productions, to be adhered on the specimen 42 is 10,000/wafer or more, but the number thereof can be reduced considerably to 200 through 500/wafer by the prevention of the sparks.

Figure 2:
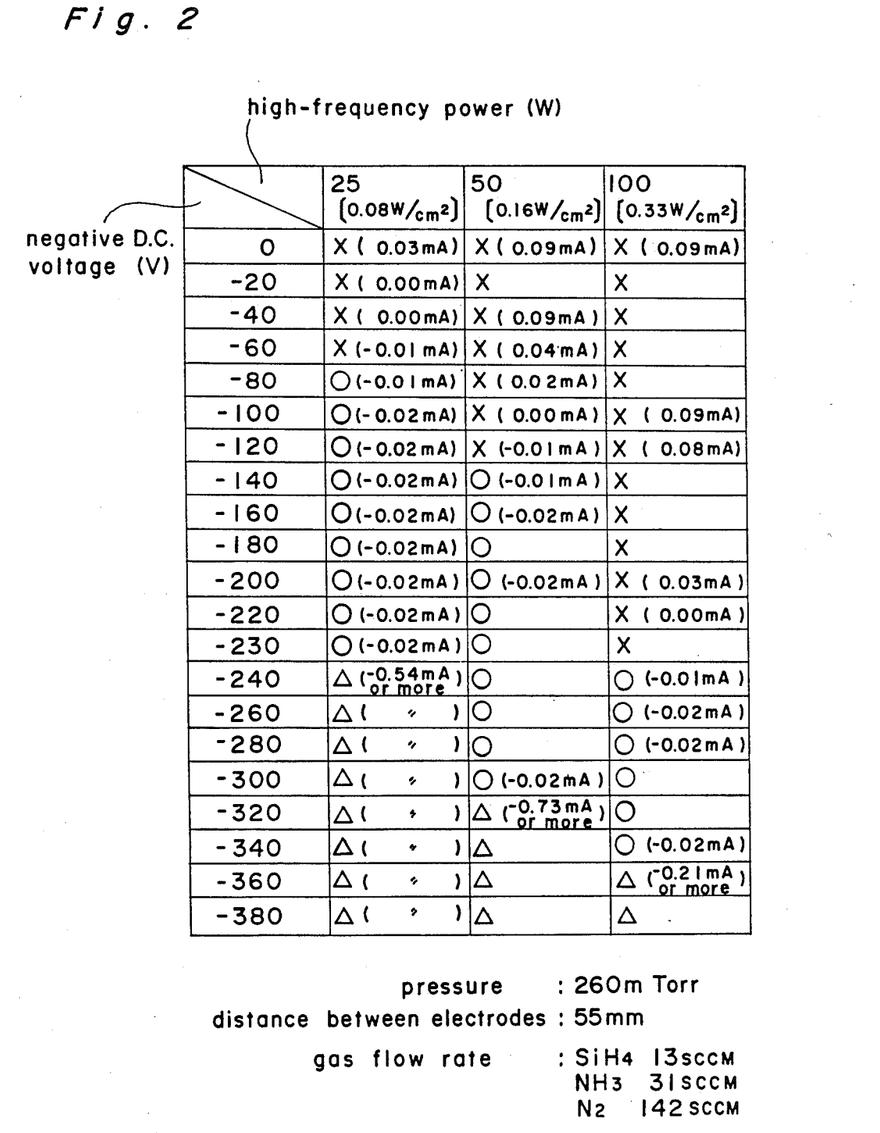
FIGS. 2, 3 and 4 are views each showing the experiment results in the same embodiment.
Figure 3:
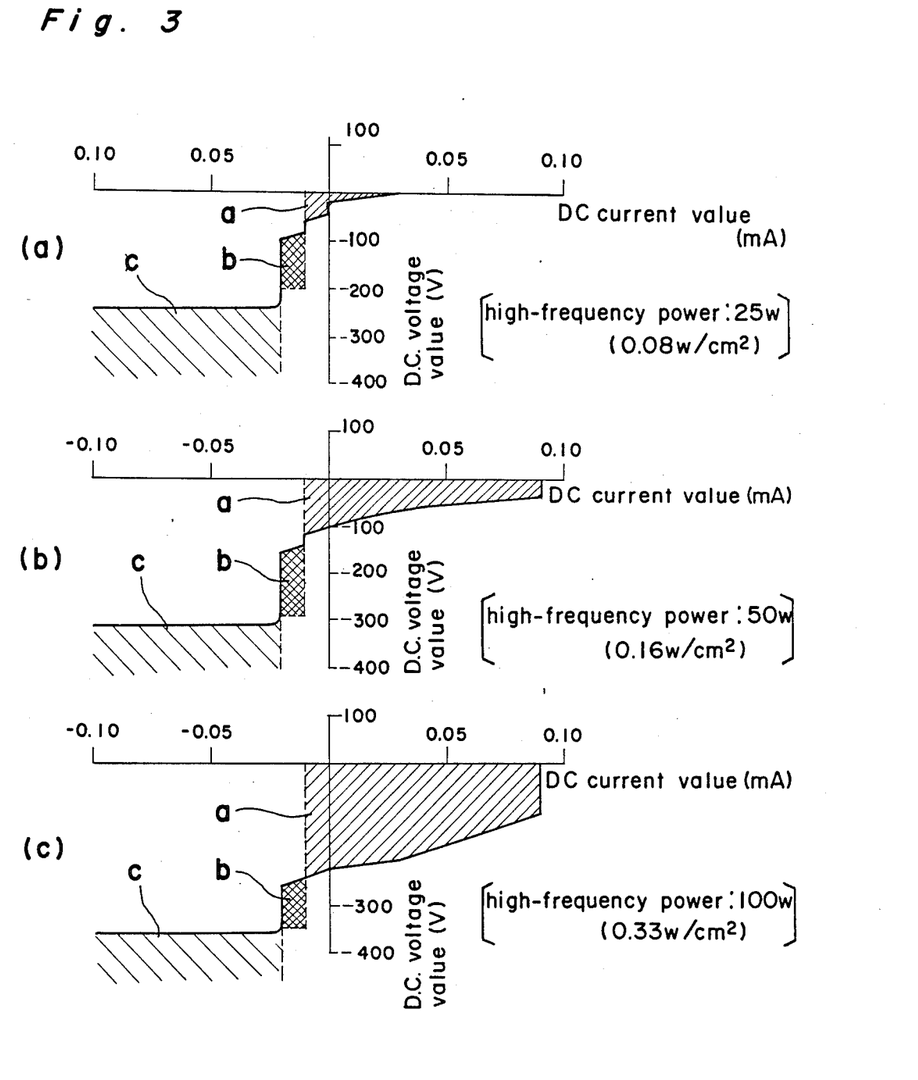

FIG. 2 and FIG. 3 show the existence of the spark production by the supply condition of the high-frequency power value and the negative DC voltage, and, also, show in results through the experiments the DC current value flowing into the ammeter 54 of this time. In FIG. 2, the 0 mark shows the conditions where the sparks have not been produced, the X mark shows the conditions where the sparks have been produced, the numeral value within the ( ) is the DC current value flowed between the filter circuit 53 and the DC power supply 52. Also, in FIG. 3, the region (b) shows the conditions where the sparks have not been produced, the region (a) shows the conditions where the sparks have been produced. Also, the region (c) in FIG. 3 and the Δ mark in FIG. 2 show the conditions where the abnormal discharge accompanying the excess current is generated. As may be understood from FIG. 2, FIG. 3, to provide the stable discharge, it is required to determine the negative DC voltage value depending upon the high-frequency power value. Here, the value of the ammeter 54 in the stable discharge condition is from −0.01 to −0.02 mA independently of the high-frequency current value. Accordingly, the negative DC voltage value for providing the stable discharge condition may be easily determined if only the voltage is applied such that the value of the ammeter 54 may become −0.01 through −0.02 mA.

Figure 4:
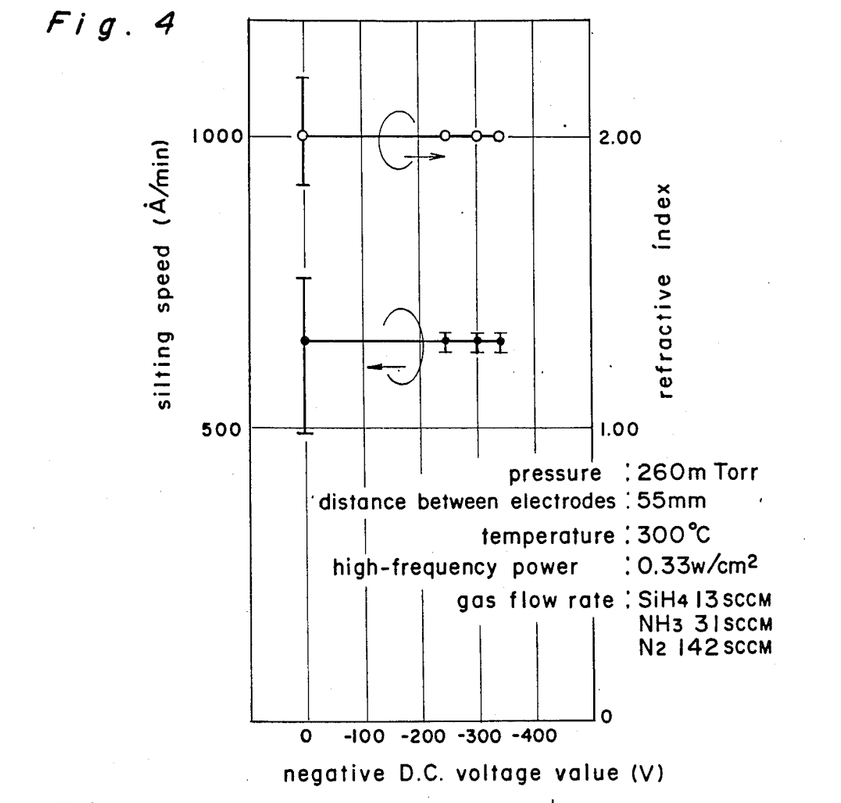

FIG. 4 shows, in results through the experiments, the dependence relation of the film accumulation speed and the refractive index with the negative DC voltage value. It is known from FIG. 4 that the forming conditions of the plasma CVD film do not change through certain negative DC voltage.

The operation which becomes the factors for such effects as described hereinabove in the present embodiment is as follows. Namely, through the application of the proper negative DC voltage upon the electrode 46, the electrons in the low temperature plasma are controlled to be flowed into the hole portion of the electrode for feeding the gas, i.e., into the portion where the pressure is locally higher than the pressure in the low-temperature plasma. As a result, the continuous or intermittent spark productions in that portion are prevented, and the electrons are charged on the electrode surfaces to which the high-frequency power is fed to prevent the sparks from being produced on the surface intermittently during the production of the low-temperature plasma. Also, the amount of the electrons flowing into the electrode is monitored indirectly by the ammeter 54 so that such negative DC voltage value may be easily determined.

In the present embodiment, the frequency of the high-frequency power supply 48 is 50 kHz, but, even in the case of 200 kHz and 400 kHz, the similar effects may be provided, thus resulting in the result independently of the frequency of the high-frequency power supply 48.

The second embodiment of the present invention will be described hereinafter with reference to the drawings.

Figure 5:
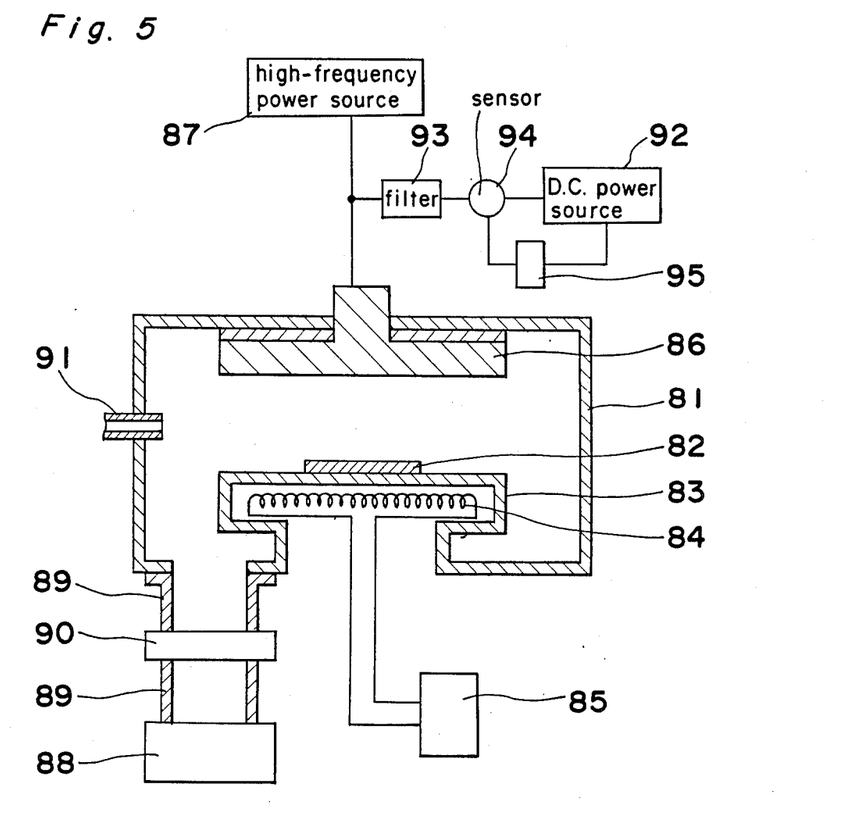
FIG. 5 is a schematic sectional view of a plasma processing apparatus in a second embodiment of the present invention.

Referring to FIG. 5, reference numeral 81 is a vacuum container. Reference numeral 82 is a sample, reference numeral 83 is a sample stand, reference numeral 84 is a heater disposed within the sample stand 83, reference numeral 85 is an AC power supply, reference numeral 86 is an electrode of aluminum in material, to which the high-frequency power and the negative DC voltage is fed, reference numeral 87 is a high-frequency power supply of 50 kHz in frequency, reference numeral 89 is a pipe for vacuum exhaust use, reference numeral 90 is a pressure control apparatus, reference numeral 91 is a gas feed apparatus, reference numeral 92 is a DC power supply for outputting the negative DC voltage, reference numeral 93 is a filter circuit which prevents the high-frequency power component from entering into the DC power supply 92, reference numeral 94 is a sensor as a current measuring means for detecting the DC current flowing between the filter circuit 93 and the DC power supply 92, and reference numeral 95 is a feedback circuit, which compares a current value detected by the sensor 94 with a set value to operate the outputted DC voltage value of the DC power supply 92 so that it may get closer to the set value.

Such plasma processing apparatus constructed as hereinabove will be described in operation hereinafter.

First, the vacuum container 81 is exhausted in vacuum as far as the vacuum degree of 30 mTorr or lower by the vacuum pump 88, thereafter the compound gases containing the composition element of the thin film to be formed on the surface of the sample 82, i.e., the blended gases of monosilane ($SiH_4$), ammonia ($NH_3$), nitrogen ($N_2$) are respectively introduced into the vacuum container 81 from the gas feed apparatus 91 respectively in the gas flow of 10 SCCM, 31 SCCM, 80 SCCM, and the pressure within the vacuum container 81 is retained at 300 mTorr through the operation of the pressure control apparatus 90. Then, the negative DC voltage of −250 V from −200 V is applied from the DC power supply 92 into the electrode 86, further the high-frequency power of the frequency 50 kHz is fed in 0.33 W/cm$^2$ (100 W) to generate the low-temperature plasma in the space containing the sample 82. The low-temperature plasma is generated and at the same time, the sensor 94 and the feed back circuit 95 are controlled to operate. At this time, the set DC value of the feedback circuit 95 is set to −0.02 mA so that the output voltage of the DC power supply 92 is automatically corrected and the operation is effected within the range from −280 V to −320 V. By the above operation, the stable low-temperature plasma is provided, the silicone nitride film within 2.000±0.03 in refractive index, I 4 % in film thickness distribution can be formed. Also, the number of the particles of 0.3 μm or more to be adhered on the sample 82 is 200 through 500/ wafer.

Figure 6:
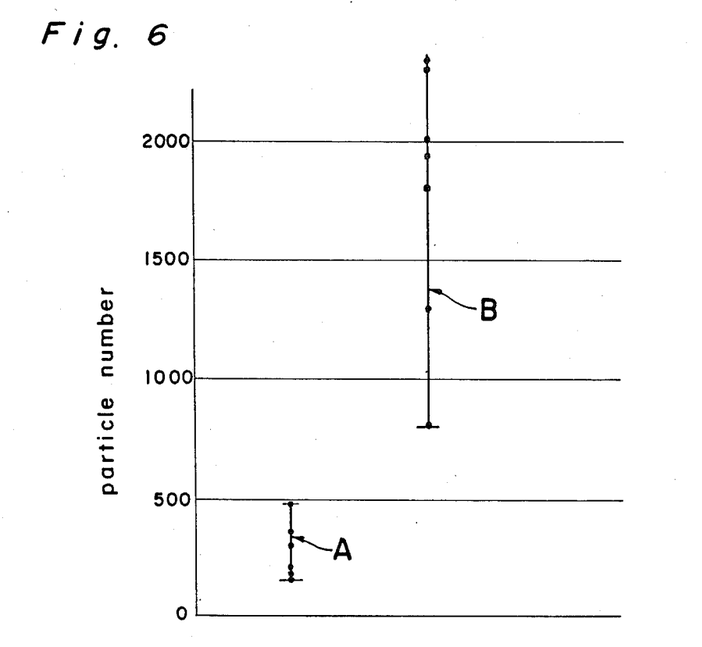
FIG. 6 is a view showing the experiment results in the same embodiment.

FIG. 6 shows the comparison experiment of the number of the particles to be adhered on the wafers after the film accumulation in a case where the negative DC voltage value is automatically controlled by the use of the feedback circuit 95 and the proper DC voltage is loaded, and where the negative DC voltage is not loaded or where the improper DC voltage is loaded. The measurement of the particles is performed by the use of a laser surface inspecting apparatus on the market An experiment point shown by an arrow A in FIG. 6 shows the former (in a case where the film accumulation has been performed through the automatic control of the negative DC voltage), a point shown by an arrow B shows the latter Here, the number of the particles shows the total sum of the particles of 0.3 μm or more.

According to the present embodiment as described hereinabove, the stable low-temperature plasma may be easily provided through the provision of a means, which is adapted to control the output value of the DC power supply 92 by the feedback circuit 95 through the DC current value detected by the sensor 94.

In the present embodiment, the frequency of high-frequency power supply 87 is 50 kHz, the similar effects may be provided even in the case of 100 kHz, 200 kHz, 400 kHz, with the result that it is independent of the frequency of the high-frequency power supply 87.

The plasma vapor-phase growth apparatus of the third embodiment of the present invention will be described hereinafter with reference to the drawings.

Figure 7:
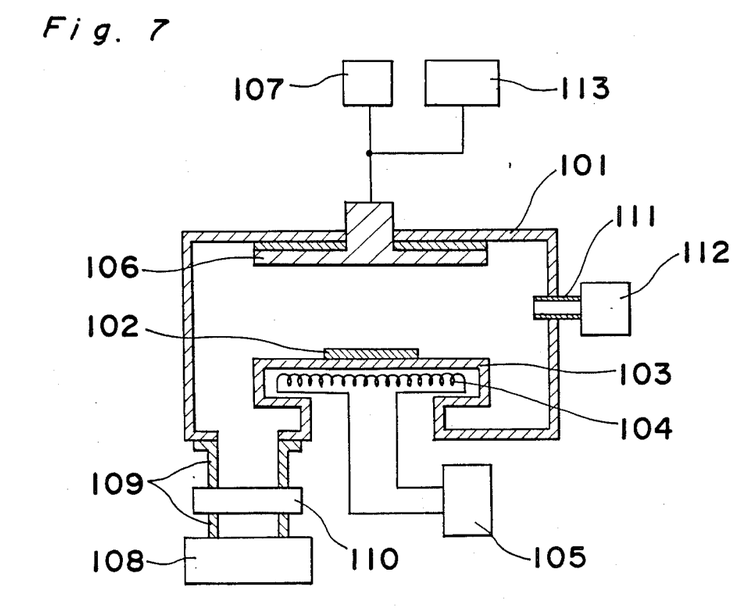
FIG. 7 is a schematic sectional view of a plasma processing apparatus in a third embodiment of the present invention.

FIG. 7 shows a schematic cross-sectional view of a plasma processing apparatus in the third embodiment of the present invention.

Referring to FIG. 7, reference numeral 101 is a vacuum container which may retain the vacuum condition. Reference numeral 102 is a sample as an object on which the plasma CVD film is formed Reference numeral 103 is a sample stand as an object retaining means, which retains the sample 102, and has a heating apparatus therein to heat the sample 102. Reference numeral 104 is a heating apparatus placed within the sample stand 103. Reference numeral 105 is an AC power supply. Reference numeral 106 is an electrode for generating the low-temperature plasma in the space containing the sample Reference numeral 107 is a high-frequency power supply for feeding the high-frequency power through a matching circuit to the electrode 106. Reference numeral 108 is a vacuum pump for exhausting in vacuum the pressure within the vacuum container 101 into the vacuum degree of the atmospheric pressure Reference numeral 109 is a pipe for vacuum exhaust use which air-tightly connects between the vacuum container 101 and the vacuum pump 108. Reference numeral 110 is a pressure control apparatus for controlling the pressure within the vacuum container 101. Reference numeral 111 is a gas introduction pipe for feeding the compound gas containing the composition element of the thin film to be accumulated on the surface of the sample 102. Reference numeral 112 is a gas flow control apparatus. Reference numeral 113 is a DC power supply for controlling and feeding through the filter circuit the negative DC voltage from 50 V to 1000 V together with the high-frequency power to the electrode 106.

Figure 8:
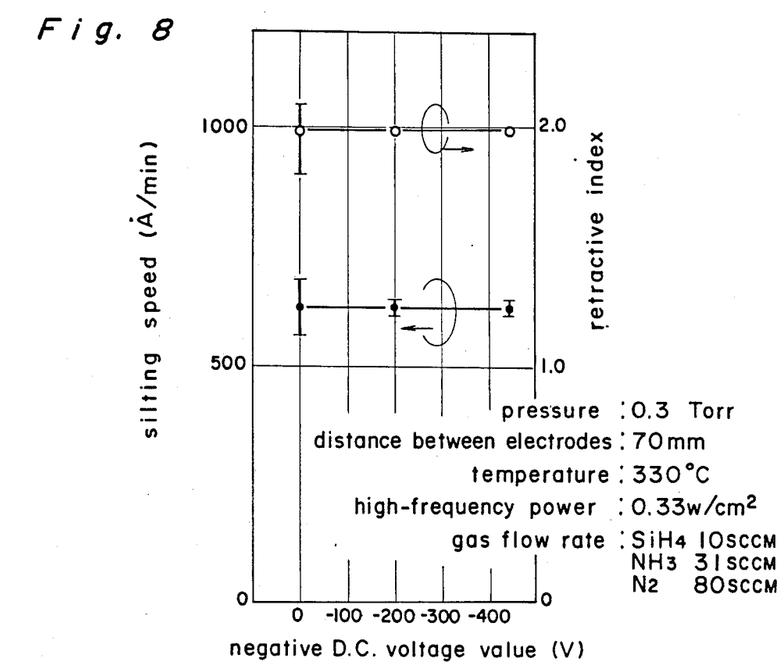
FIG. 8 is a view showing the experiment results in the same embodiment.

The operation will be described about the plasma processing apparatus constructed as herein above with the use of FIG. 7, FIG. 8.

First, the vacuum container 101 is exhausted in vacuum as far as the vacuum degree of 30 mTorr or lower by the vacuum pump 108, thereafter the compound gases containing the composition element of the thin film to be formed on the surface of the sample 102, i.e., the blended gases of monosilane (SiH$_4$), ammonia (NH$_3$), nitrogen (N$_2$) are respectively introduced into the vacuum container 101 from the gas introduction pipe 111 through the gas flow control apparatus 112 respectively in the gas flow of 10 SCCM, 31 SCCM, 80 SCCM and the pressure within the vacuum container 101 is retained at 0.30 mTorr through the operation of the pressure control apparatus 110. Then, the negative DC voltage $-300$ V is applied upon the electrode 106, in this condition, further the high-frequency power of the frequency 50 kHz is fed in 0.33 W/cm$^2$ (100 W) to generate the low-temperature plasma in the space containing the sample 102. The silicone nitride film within 1.99±0.02 in refractive index, ±3% in film thickness distribution can be formed on the surface of the sample 102 by the above-described operation. Here, according to the number of the particles of 0.3 μm or more on the surface of the sample 102 measured by the laser surface inspection apparatus is 300 or more on the conventional apparatus, but it could be considerably reduced within 40 or less by the application of the negative DC voltage from $-200$ V to $-600$ V and the accumulation on the surface of the electrode 106 can hardly be observed FIG. 8 shows, in the experiment result, the dependence relation of the film accumulation speed and the refractive index with the negative DC voltage value. When it is accumulated on the sample 102 by the negative DC voltage from FIG. 8, the forming conditions do not change.

In the present embodiment, the operation as a factor by which such effects as described hereinabove are provided is as follows. Namely, the negative DC voltage is applied upon the electrode 106, the atoms or the molecules of the positive ions in the low-temperature plasma are accelerated, attracted in the direction of the electrodes 106, and the controlling operation is performed so that the spattering phenomena may be caused on the surface of the electrode 106 to remove in the atom shape or the molecule) shape the accumulation attached to the surface of the electrode 106 while the plasma CVD film is being accumulated on the sample.

In the present embodiment, the gases to be fed into the vacuum container 101 are the blended gases to monosilane (SiH$_4$), ammonia (NH$_3$), nitrogen (N$_2$), but an inactive gas such as argon (Ar), xenon or the like is added to these compound gases so that the spattering phenomena on the surface of the electrode 106 are likely to be controlled by the negative DC voltage. Also, when the surface of the sample 102 depends upon the material quality of the electrode 108, so that it may be polluted by the heavy metal through the spattering effect, the material quality is necessary to be the same as that of the plasma CVD film to be accumulated on the surface of the sample 102 or to be material quality including the composition element of the plasma CVD film. Namely, the material quality of the electrode 106 is necessary to be silicon, silicon nitride or the like.

It is to be noted that in the present embodiment, the frequency of the high frequency power supply 107 is 50 kHz, the similar effects may be provided even in the case of 200 kHz, 400 kHz, and the frequency is independent of the high frequency power supply 107.

Then, the fourth embodiment of the present invention will be described hereinafter with reference to the drawings.

Figure 9:
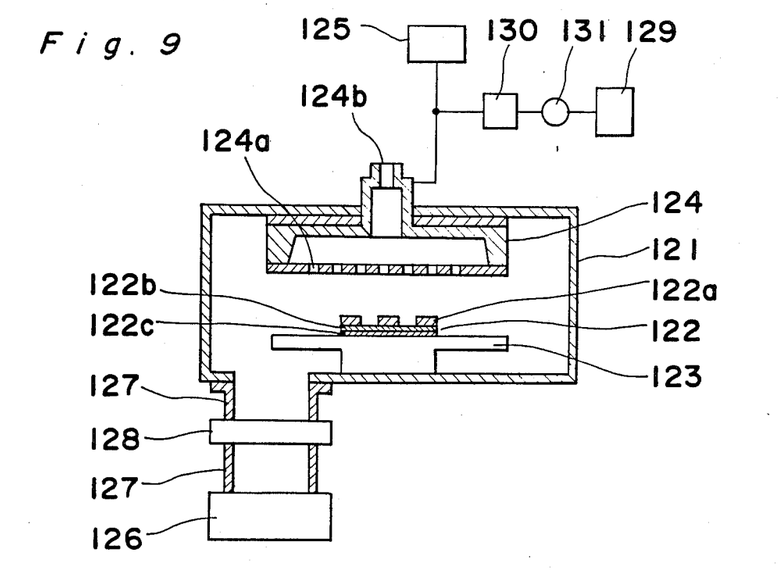
FIG. 9 is a schematic view of a plasma processing apparatus in a fourth embodiment of the present invention.

FIG. 9 is a schematic cross-sectional view of the plasma processing apparatus showing the fourth embodiment of the present invention.

In FIG. 9, reference numeral 121 is a vacuum container by which the vacuum condition may be maintained. Reference numeral 122 is a sample as an object patterned by resist mask, reference numeral 122a is the resist mask, reference numeral 122b of the sample 122 is a silicon base-plate. Reference numeral 123 is an earthed sample stand as an object retaining means. Reference numeral 124 is an electrode, where the high-frequency power is fed, a plurality of ports each being 0.8 mm in diameter are provided in the face opposite to the sample 122, the gas is fed through the ports into the vacuum container 121, reference numeral 124a is a plurality of ports for introducing the gas into the vacuum container 121, reference numeral 124b is a feed port for feeding the gas through the flow control apparatus into the electrode 124. Reference numeral 125 is a high-frequency power supply of 50 kHz in frequency. Reference numeral 126 is a vacuum pump for exhausting in vacuum the pressure within the vacuum container 121 into the vacuum degree of the atmospheric pressure or lower Reference numeral 127 is a pipe for vacuum exhaust use, which air-tightly connects between the vacuum container 121 and the vacuum pump 126. Reference numeral 128 is a pressure control apparatus for adjusting the pressure within the vacuum container 121 through the variation in the resistance within the pipe. Reference numeral 129 is a DC power supply for feeding the negative DC voltage through the filter circuit into the electrode 124. Reference numeral 130 is a filter provided so that the power of the high-frequency component may not pass in the direction of the DC power supply 129. Reference numeral 131 is an ammeter for measuring the DC current flowing into the section between the filter 130 and the DC power supply 129.

The operation of the plasma processing apparatus constructed as described hereinabove will be described with reference to FIGS. 9 through 11.

First, the interior of the vacuum container 121 is exhausted in vacuum as far as the vacuum degree of 100 mTorr or lower by the vacuum pump 126. Thereafter, sulphur hexafluoride ($SF_6$) gas is introduced into the electrode 124 from the feed port 124b into the flow amount of 240 SCCM through the gas flow control apparatus, and is introduced into the vacuum container 121 from the port 124a of the electrode 124, and the pressure within the vacuum container 121 is retained at 290 mTorr by the operation of the pressure control apparatus 128. Then, the high-frequency power 100 W (0.33 W/cm$^3$) and the negative DC voltage value $-100$ V are fed to the electrode 124 to generate the low-temperature plasma in the space including the sample 122. At this time, the DC power supply 129 is operated so that the value may become closer to 0.09 mA from $-0.02$ mA through confirmation of the value of the ammeter 131 so as to correct the negative DC voltage value. In our experiment, it is corrected to $-130$ V. The silicon nitride film 122b can be etched through the resist mask 122a by the above operation or without the discharge fluctuation. At this time, the etching speed of the silicon nitride film is 4000 Å/minute, the etching dispersion is $\pm 2.1\%$, the etching speed of the resist is approximately 300 Å/minute (negative resist).

Figure 10:
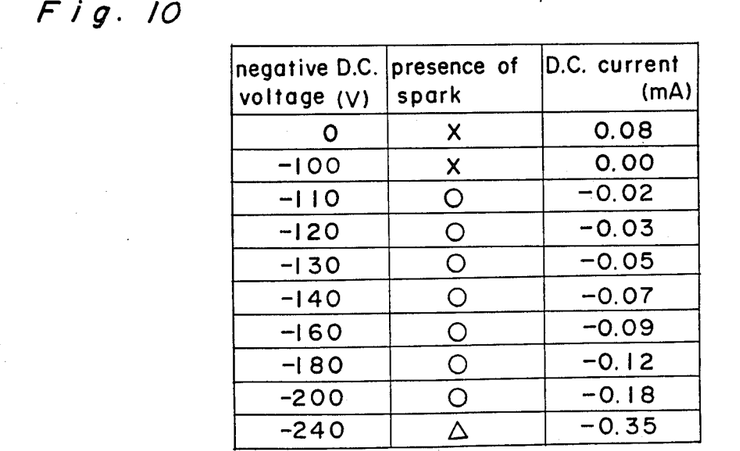
FIGS. 10 and 11 are views each showing the experiment results in the same embodiment.
Figure 11:
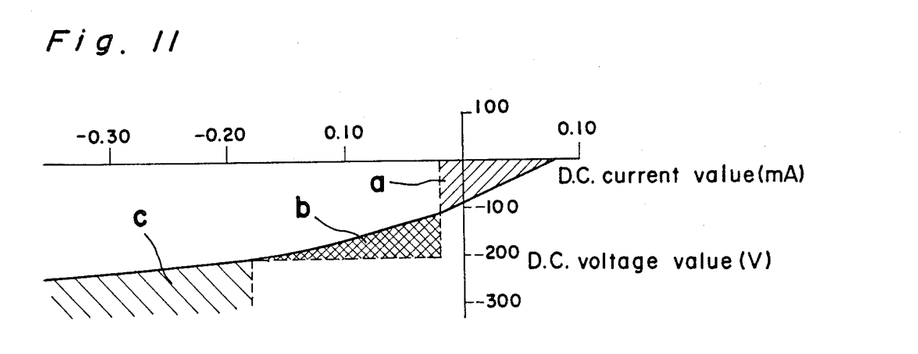

FIGS. 10 and 11 show the existence of the spark in a case where the negative DC voltage value has been changed under the constant high-frequency power value 100 W (0.33 W/cm$^3$), and the DC current value in the experiment results flowing into the ammeter 131 at this time. In FIGS. 10 and 11, the X mark and the region (a) show the conditions where the spark or the discharge fluctuation has been generated, the 0 mark and the region (b) show the conditions where the stable low-temperature plasma has been generated Also, the Δ mark and the region (c) show the conditions where the very little sparks (abnormal discharge) have been innumerably generated on the surface of the electrode 124. Accordingly, to generate the stable low-temperature plasma, it is necessary to determine the negative DC voltage value so that the value of the ammeter 131 may become within the range of $-0.15$ mA from $-0.02$ mA. Also, the etching speed does not change by the negative DC voltage according to the experiment of the dependence relation between the etching speed and the negative DC voltage value.

The operation as a factor, by which such an effect as described hereinabove is provided in the present embodiment is as follows. Namely, through the application of the proper negative DC voltage upon the electrode 124, the electrons in the low-temperature plasma are controlled to be flowed into the hole portion of the electrode for feeding the gas, i.e., into the portion where the pressure is locally higher than the pressure in the low-temperature plasma. As a result, the continuous or intermittent spark productions in that portion are prevented, the electrons are charged on the electrode surfaces to which the high-frequency power is fed to prevent the sparks from being produced on the surface intermittently during the production of the low-temperature plasma. Also, the amount of the electrons flowing into the electrode 124 is monitored indirectly by the ammeter 131 so that such negative DC voltage value as the electrons do not flow in may be easily determined.

It is to be noted that in the present embodiment, the frequency of the high-frequency power supply 125 is 50 kHz, but the other frequencies may be used.

The fifth embodiment of the present invention will be described hereinafter with reference to the drawings.

Figure 12:
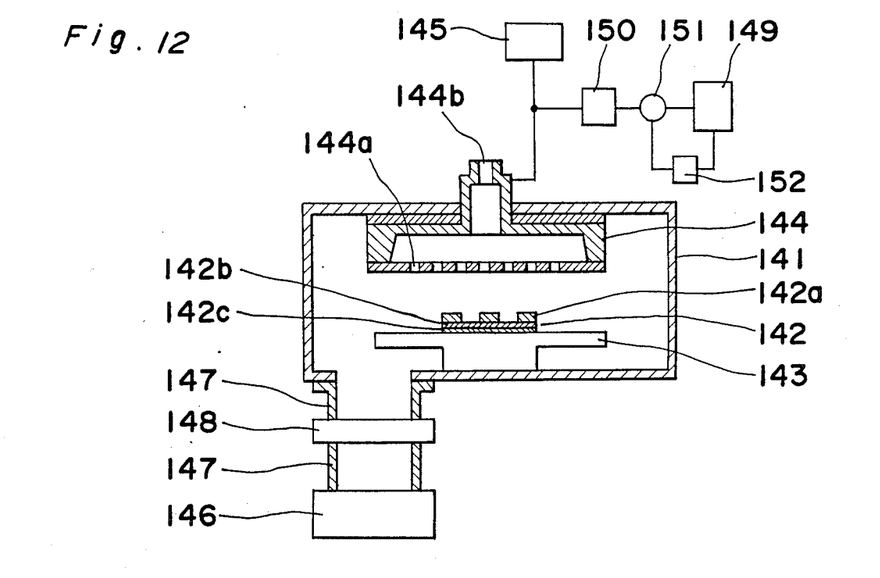
FIG. 12 is a schematic sectional view of a plasma processing apparatus in a fifth embodiment of the present invention.

FIG. 12 is a schematic cross-sectional view of a dry etching apparatus showing the fifth embodiment of the present invention.

In FIG. 12, reference numeral 141 is a vacuum container by which the vacuum condition may be maintained. Reference numeral 142 is a sample patterned by resist mask, reference numeral 142a is the resist mask, reference numeral 142b is a nitrogen silicon film, reference numeral 142c is a silicon base-plate. Reference numeral 143 is an earthed sample stand. Reference numeral 144 is an electrode, where the high-frequency power is fed, a plurality of ports each being 0.8 mm in diameter are provided in the face opposite to the sample 142, the gas is fed through the ports into the vacuum container 141, reference numeral 144a is a plurality of ports for introducing the gas into the vacuum container 141, reference numeral 144b is a feed port for feeding the gas through the flow control apparatus into the electrode 144. Reference numeral 145 is a high-frequency power supply. Reference numeral 146 is a vacuum pump for exhausting in vacuum the pressure within the vacuum container 141 into the vacuum degree of the atmospheric pressure or lower Reference numeral 147 is a pipe for vacuum exhaust use, which air-tightly connects between the vacuum container 141 and the vacuum pump 146. Reference numeral 148 is a pressure control apparatus for adjusting the pressure within the vacuum container 141 through the variation in the resistance within the pipe Reference numeral 149 is a DC power supply for feeding the negative DC voltage through the filter circuit into the electrode 144. Reference numeral 150 is a filter provided so that the power of the high-frequency component may not pass in the direction of the DC power supply 149 Reference numeral 151 is a sensor for detecting DC current flowing into the section between the filter 150 and the DC power supply 149 Reference numeral 152 is a feedback circuit for comparing the current value detected by the sensor 151 with the set value to operate the outputted DC voltage value of the DC power supply so that it may become close to the set value.

Such a dry etching apparatus constructed as described hereinabove will be described hereinafter in its operation with reference to FIG. 12 and its subsequent First, the interior of the vacuum container 141 is exhausted in vacuum as far as the vacuum degree of 100 mTorr or lower by the vacuum pump 146. Thereafter, sulphur hexafluoride ($SF_5$) gas is introduced into the electrode 144 from the feed port 144b in the flow amount of 240 SCCM through the gas flow control apparatus, is introduced into the vacuum container 141 from the port 144a of the electrode 144, and the pressure within the vacuum container 141 is retained at 290 mTorr by the operation of the pressure control apparatus 148. Then, the high-frequency power 100 W (0.33 W/cm$^3$) and the negative DC voltage value $-100$ V are fed to the electrode 144 to generate the low-temperature plasma in the space including the sample 142. At this time, the set current value of the feedback circuit 152 is set to $-0.03$ mA to automatically correct the output voltage of the DC power supply 149 for the operation in the range from −140 V to −170 V. By the above operation, the stable low-temperature plasma is provided. The silicon nitride film 142b can be etched through the resist mask 142a without causing the spark in the port 144a or without the discharge fluctuation. At this time, the etching speed of the silicon nitride film is 4000 Å/minute, the etching dispersion is ±2.1%, the etching speed of the resist is approximately 20 Å/minute (negative resist).

According to the present embodiment as described hereinabove, a means for controlling the output value of the DC power supply 149 by the feed-back circuit 152 of the DC current value detected by the sensor 151 is provided so that the stable low-temperature plasma may be easily provided.

As is clear from the foregoing description, according to the arrangement of the present invention, a given negative DC voltage is loaded through the filter circuit upon the electrode which generates the low-temperature plasma through the feed of the high-frequency power so as to prevent the spark from being generated to obtain the stable low-temperature or to prevent the accumulation from adhering on the electrode. As a result, the present invention has an effect capable of the superior plasma processing.

Although the present invention has been fully described by way of example with reference to the accompanying drawings, it is to be noted here that various changes and modifications will be apparent to those skilled in the art. Therefore, unless otherwise such changes and modifications depart from the scope of the present invention, they should be construed as being included therein.

What is claimed is:

1. A plasma processing apparatus comprising:
   a vacuum container which is capable of maintaining a vacuum therein;
   a vacuum exhaust means connected to said container for producing a vacuum in the interior of said container;
   a pressure control means operatively associated with said vacuum exhaust means for maintaining the vacuum within the vacuum container at a predetermined value;
   a gas supply means connected to said container for introducing a gas into the container for carrying out a plasma-using process on an object;
   an object holding means in said container for holding the object;
   heating means in said container for heating the object held on the object holding means;
   an electrode within said container in spaced opposed relationship to the object holding means for generating a low-temperature plasma between said electrode and said object holding means;
   a high frequency power supply connected to said electrode for supplying high frequency power to said electrode;
   a high frequency power blocking means connected to the connection between said high frequency power supply and said electrode; and
   a DC power supply connected to said high frequency power blocking means for supplying a negative DC voltage to said electrode through said high frequency power blocking means simultaneously with the high frequency power.

2. A plasma processing apparatus as claimed in claim 1 in which said high frequency power supply comprises means for supplying power at a frequency of at least 50 kHz.

3. A plasma processing apparatus as claimed in claim 1 in which said high frequency power blocking means is a filter circuit.

4. A plasma processing apparatus as claimed in claim 1 further comprising a current measuring means connected between said DC power supply and said high frequency power blocking means.

5. A plasma processing apparatus as claimed in claim 4 further comprising means connected between said current measuring means and said DC power supply for controlling the value of the negative voltage supplied from the DC power supply to a predetermined value in accordance with the value of the current measured by said current measuring means.

6. A plasma processing apparatus as claimed in claim 1 in which said DC power supply means comprise means for supplying DC power at a negative voltage of from 50 to 1000 V.

7. A plasma processing apparatus as claimed in claim 1 in which said gas supply means comprises means for supplying a gas containing at least one element to be deposited on the object by a chemical vapor deposition and an inert gas taken from the group consisting of argon and xenon.

8. A plasma processing apparatus as claimed in claim 1 in which said electrode is a material mainly composed of at least one element to be deposited on the object by a chemical vapor deposition.

9. A plasma processing apparatus as claimed in claim 1 in which said electrode is a material which is the same as the material to be deposited on the object by a chemical vapor deposition.

10. A plasma processing apparatus as claimed in claim 1 in which said gas supply means comprises means for supplying a gas containing a material for dry etching the object.

* * * * *